(12) United States Patent
Jung

(10) Patent No.: US 10,580,466 B2
(45) Date of Patent: *Mar. 3, 2020

(54) TRANSMITTING DEVICE USING CALIBRATION CIRCUIT, SEMICONDUCTOR APPARATUS AND SYSTEM INCLUDING THE SAME

(71) Applicant: SK hynix Inc., Icheon-si, Gyeonggi-do (KR)

(72) Inventor: Hae Kang Jung, Gwangmyeong-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/387,379

(22) Filed: Apr. 17, 2019

(65) Prior Publication Data

US 2019/0244643 A1    Aug. 8, 2019

Related U.S. Application Data

(63) Continuation of application No. 15/970,444, filed on May 3, 2018, now Pat. No. 10,304,503.

(30) Foreign Application Priority Data

Sep. 27, 2017  (KR) .......................... 10-2017-0125274

(51) Int. Cl.
*H03K 19/00* (2006.01)
*H03K 19/0175* (2006.01)
(Continued)

(52) U.S. Cl.
CPC ....... *G11C 7/1057* (2013.01); *H03K 17/6872* (2013.01); *H03K 19/0005* (2013.01);
(Continued)

(58) Field of Classification Search
CPC ....... H03K 19/0005; H03K 19/017545; H03K 17/6872; H03K 17/687; H03K 19/00384;
(Continued)

(56) References Cited

U.S. PATENT DOCUMENTS 7,825,682 B1   11/2010   Wang et al.
7,893,710 B2    2/2011   Lee
(Continued)

FOREIGN PATENT DOCUMENTS

KR      1020180038104 A      4/2018

*Primary Examiner* — Vibol Tan
(74) *Attorney, Agent, or Firm* — William Park & Associates Ltd.

(57) ABSTRACT

A transmitting device includes a calibration circuit and a transmission circuit. The calibration circuit generates calibration codes by performing a calibration operation. The calibration circuit also generates compensation calibration codes by increasing or decreasing values of the calibration codes according to whether a number of codes among the calibration codes having a predetermined level is greater than or equal to a threshold value. The transmission circuit drives a signal transmission line based on an input signal and the compensation calibration codes.

18 Claims, 5 Drawing Sheets

(51) Int. Cl.
*G11C 7/10* (2006.01)
*H04L 25/02* (2006.01)
*H03K 17/687* (2006.01)
*H03K 19/0185* (2006.01)

(52) U.S. Cl.
CPC ............ *H03K 19/017545* (2013.01); *H03K 19/018571* (2013.01); *H04L 25/0278* (2013.01); *G11C 2207/2254* (2013.01)

(58) Field of Classification Search
CPC ... H03K 19/017509; H03K 19/018571; H03K 19/018585; H03K 2005/00058; H03K 17/16; H03K 17/6871; H03K 19/018521; H03K 2217/94031; H03K 5/131; G11C 7/1057; G11C 2207/2254; G11C 11/4093; G11C 29/022; G11C 29/50008; G11C 2211/4061; G11C 7/10; G11C 7/1003; H04L 25/0278; H04L 25/0298; H03H 11/28; H03H 7/38; H04B 17/11
See application file for complete search history.

(56) References Cited

U.S. PATENT DOCUMENTS

| | | | |
|---|---|---|---|
| 7,911,225 | B2 | 3/2011 | Ahn et al. |
| 9,413,565 | B1 | 8/2016 | Jung |
| 9,531,362 | B1 | 12/2016 | Kim |
| 9,666,245 | B2 * | 5/2017 | Arai ............... G11C 29/021 |
| 9,859,869 | B1 | 1/2018 | Lee |
| 10,026,457 | B2 * | 7/2018 | Arai ............... G11C 29/021 |
| 10,083,763 | B2 | 9/2018 | Jang et al. |
| 10,205,451 | B1 * | 2/2019 | Johnson ........... G11C 7/1084 |
| 10,339,984 | B2 * | 7/2019 | Arai ............... G11C 29/021 |
| 2017/0099050 | A1 | 4/2017 | Lee et al. |
| 2018/0123593 | A1 | 5/2018 | Choi |

* cited by examiner

| | CAL<6> | CAL<5> | CAL<4> | CAL<3> | CAL<2> | CAL<1> | SUM |
|---|---|---|---|---|---|---|---|
| 1 | 0 | 0 | 0 | 0 | 0 | 0 | 0 |
| 2 | 0 | 0 | 0 | 0 | 0 | 1 | 1 |
| 3 | 0 | 0 | 0 | 0 | 1 | 0 | 1 |
| 4 | 0 | 0 | 0 | 0 | 1 | 1 | 2 |
| 5 | 0 | 0 | 0 | 1 | 0 | 0 | 1 |
| 6 | 0 | 0 | 0 | 1 | 0 | 1 | 2 |
| 7 | 0 | 0 | 0 | 1 | 1 | 0 | 2 |
| 8 | 0 | 0 | 0 | 1 | 1 | 1 | 3 |
| 9 | 0 | 0 | 1 | 0 | 0 | 0 | 1 |
| 10 | 0 | 0 | 1 | 0 | 0 | 1 | 2 |
| 11 | 0 | 0 | 1 | 0 | 1 | 0 | 2 |
| 12 | 0 | 0 | 1 | 0 | 1 | 1 | 3 |
| 13 | 0 | 0 | 1 | 1 | 0 | 0 | 2 |
| 14 | 0 | 0 | 1 | 1 | 0 | 1 | 3 |
| 15 | 0 | 0 | 1 | 1 | 1 | 0 | 3 |
| 16 | 0 | 0 | 1 | 1 | 1 | 1 | 4 |
| 17 | 0 | 1 | 0 | 0 | 0 | 0 | 1 |
| 18 | 0 | 1 | 0 | 0 | 0 | 1 | 2 |
| 19 | 0 | 1 | 0 | 0 | 1 | 0 | 2 |
| 20 | 0 | 1 | 0 | 0 | 1 | 1 | 3 |
| 21 | 0 | 1 | 0 | 1 | 0 | 0 | 2 |
| 22 | 0 | 1 | 0 | 1 | 0 | 1 | 3 |
| 23 | 0 | 1 | 0 | 1 | 1 | 0 | 3 |
| 24 | 0 | 1 | 0 | 1 | 1 | 1 | 4 |
| 25 | 0 | 1 | 1 | 0 | 0 | 0 | 2 |
| 26 | 0 | 1 | 1 | 0 | 0 | 1 | 3 |
| 27 | 0 | 1 | 1 | 0 | 1 | 0 | 3 |
| 28 | 0 | 1 | 1 | 0 | 1 | 1 | 4 |
| 29 | 0 | 1 | 1 | 1 | 0 | 0 | 3 |
| 30 | 0 | 1 | 1 | 1 | 0 | 1 | 4 |
| 31 | 0 | 1 | 1 | 1 | 1 | 0 | 4 |
| 32 | 0 | 1 | 1 | 1 | 1 | 1 | 5 | a

FIG.7B

| | CAL<6> | CAL<5> | CAL<4> | CAL<3> | CAL<2> | CAL<1> | SUM |
|---|---|---|---|---|---|---|---|
| 33 | 1 | 0 | 0 | 0 | 0 | 0 | 1 |
| 34 | 1 | 0 | 0 | 0 | 0 | 1 | 2 |
| 35 | 1 | 0 | 0 | 0 | 1 | 0 | 2 |
| 36 | 1 | 0 | 0 | 0 | 1 | 1 | 3 |
| 37 | 1 | 0 | 0 | 1 | 0 | 0 | 2 |
| 38 | 1 | 0 | 0 | 1 | 0 | 1 | 3 |
| 39 | 1 | 0 | 0 | 1 | 1 | 0 | 3 |
| 40 | 1 | 0 | 0 | 1 | 1 | 1 | 4 |
| 41 | 1 | 0 | 1 | 0 | 0 | 0 | 2 |
| 42 | 1 | 0 | 1 | 0 | 0 | 1 | 3 |
| 43 | 1 | 0 | 1 | 0 | 1 | 0 | 3 |
| 44 | 1 | 0 | 1 | 0 | 1 | 1 | 4 |
| 45 | 1 | 0 | 1 | 1 | 0 | 0 | 3 |
| 46 | 1 | 0 | 1 | 1 | 0 | 1 | 4 |
| 47 | 1 | 0 | 1 | 1 | 1 | 0 | 4 |
| 48 | 1 | 0 | 1 | 1 | 1 | 1 | 5 |
| 49 | 1 | 1 | 0 | 0 | 0 | 0 | 2 |
| 50 | 1 | 1 | 0 | 0 | 0 | 1 | 3 |
| 51 | 1 | 1 | 0 | 0 | 1 | 0 | 3 |
| 52 | 1 | 1 | 0 | 0 | 1 | 1 | 4 |
| 53 | 1 | 1 | 0 | 1 | 0 | 0 | 3 |
| 54 | 1 | 1 | 0 | 1 | 0 | 1 | 4 |
| 55 | 1 | 1 | 0 | 1 | 1 | 0 | 4 |
| 56 | 1 | 1 | 0 | 1 | 1 | 1 | 5 |
| 57 | 1 | 1 | 1 | 0 | 0 | 0 | 3 |
| 58 | 1 | 1 | 1 | 0 | 0 | 1 | 4 |
| 59 | 1 | 1 | 1 | 0 | 1 | 0 | 4 |
| 60 | 1 | 1 | 1 | 0 | 1 | 1 | 5 |
| 61 | 1 | 1 | 1 | 1 | 0 | 0 | 4 |
| 62 | 1 | 1 | 1 | 1 | 0 | 1 | 5 |
| 63 | 1 | 1 | 1 | 1 | 1 | 0 | 5 |
| 64 | 1 | 1 | 1 | 1 | 1 | 1 | 6 |

TRANSMITTING DEVICE USING CALIBRATION CIRCUIT, SEMICONDUCTOR APPARATUS AND SYSTEM INCLUDING THE SAME

CROSS-REFERENCES TO RELATED APPLICATION

The present application is a continuation application of U.S. patent application Ser. No. 15/970,444, filed on May 3, 2018, and claims priority under 35 U.S.C. § 119(a) to Korean application number 0-2017-0125274, filed on Sep. 27, 2017, in the Korean Intellectual Property Office, which is incorporated herein by reference in its entirety.

BACKGROUND

1. Technical Field

Various embodiments of the present invention relate to a semiconductor technology and, more particularly, to a transmitting device using a calibration circuit, a semiconductor apparatus, and system including the transmitting device.

2. Related Art

An electronic device includes many electronic elements, and a computer system includes many electronic elements which include semiconductor apparatuses. Semiconductor apparatuses of computer systems may transmit data through data transmission devices. As semiconductor apparatuses operate at higher speeds while consuming less power, transmission signals may be distorted due to external noise and impedance mismatching between semiconductor apparatuses communicating with each other, Therefore, semiconductor apparatuses perform an operation of matching impedances or resistances between data transmission devices.

Accordingly, a semiconductor apparatus generally includes an on-die termination circuit configured to perform impedance matching for accurate signal transmission. For precise impedance matching, a semiconductor apparatus should perform an operation of adjusting termination resistance according to PVT variation. In general, a memory device is coupled to an external reference resistance and performs an operation of adjusting an impedance value of the termination resistance by performing a calibration operation using the external reference resistance, which is generally referred to as a "ZQ calibration operation."

SUMMARY

In accordance with the present teachings is a transmitting device including a calibration circuit configured to generate calibration codes by performing a calibration operation and configured to generate compensation calibration codes by increasing or decreasing values of the calibration codes when a number of codes among the calibration codes having a predetermined level is greater than or equal to a threshold value. The transmitting device also includes a transmission circuit configured to drive a signal transmission line based on an input signal and the compensation calibration codes.

Also in accordance with the present teachings is a transmitting device including a calibration circuit configured to generate calibration codes by performing a calibration operation, configured to generate converted calibration codes by increasing or decreasing values of the calibration codes based on whether a number of codes among the calibration codes having a predetermined level is greater than or equal to a threshold value, and configured to generate compensation calibration codes from the calibration codes or the converted calibration codes according to an operation mode signal. The transmitting device further includes a transmission circuit configured to drive a signal transmission line based on an input signal and the compensation calibration codes.

Further in accordance with the present teachings is a transmitting device including a calibration circuit configured to generate calibration codes by performing a calibration operation and configured to generate compensation calibration codes by changing the calibration codes when a number of codes among the calibration codes having a predetermined level is greater than or equal to a threshold value. The transmitting device also includes a transmission circuit configured to drive a signal transmission line based on an input signal and the compensation calibration codes, wherein the transmission circuit includes a main driver having a pull-up resistance and a pull-down resistance set based on the compensation calibration codes.

BRIEF DESCRIPTION OF THE DRAWINGS

FIGS. 7A and 7B show a table illustrating a method of operation of the code decoder shown in FIG. 6.

DETAILED DESCRIPTION

Figure 1:
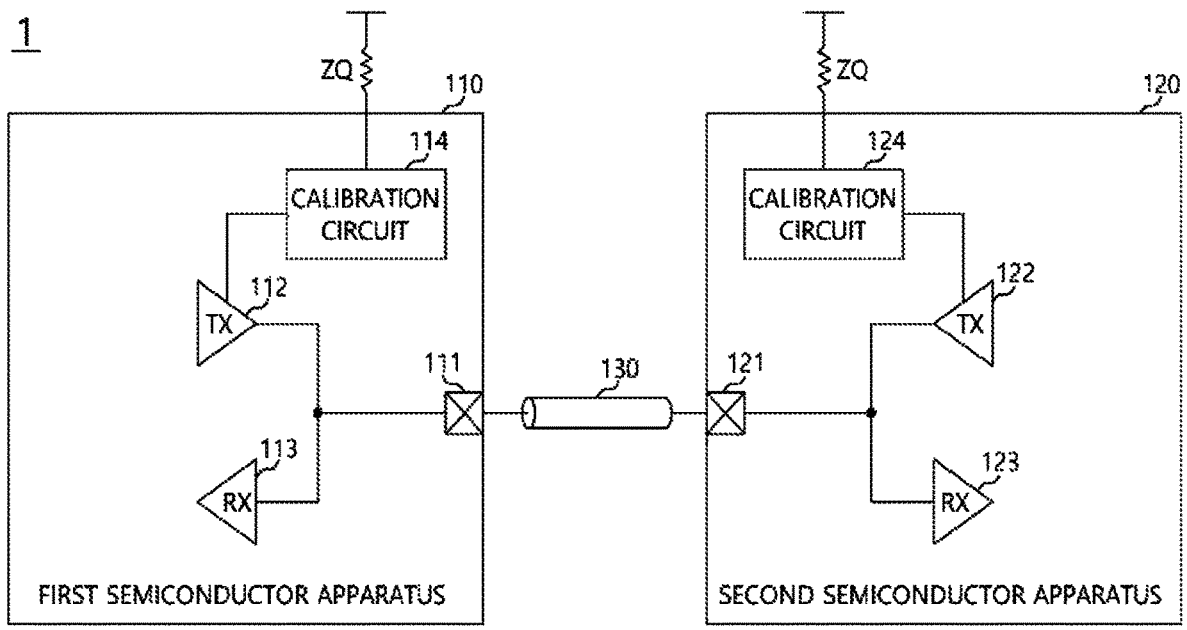
FIG. 1 shows a schematic diagram illustrating a configuration of a semiconductor system in accordance with an embodiment of the present disclosure.

Various disclosed embodiments provide a calibration circuit, capable of generating a calibration code suitable to operation modes of a semiconductor apparatus having a transmitting circuit or a semiconductor system having multiple transmitting circuits.

In accordance with the present teachings is a transmitting device including a calibration circuit configured to generate calibration codes by performing a calibration operation and configured to generate compensation calibration codes by increasing or decreasing values of the calibration codes when a number of codes among the calibration codes having a predetermined level is greater than or equal to a threshold value. The transmitting device also includes a transmission circuit configured to drive a signal transmission line based on an input signal and the compensation calibration codes.

In one embodiment, the calibration circuit includes a calibration code generator coupled to an external reference resistance, wherein the calibration code generator is configured to generate the calibration codes. The calibration circuit also includes a calibration code converter configured to generate converted calibration codes from the calibration codes and configured to select the calibration codes or the converted calibration codes as the compensation calibration codes based on an operation mode signal. In some instances, the operation mode signal provides an indication that a semiconductor apparatus associated with the transmission circuit is operating in a low power mode. For one case, the operation mode signal is enabled when the semiconductor apparatus associated with the transmission circuit is operating in the low power mode.

In a further embodiment, the calibration code converter includes a code decoder configured to generate the converted calibration codes by increasing or decreasing values of the calibration codes when the number of codes among the calibration codes having the predetermined level is greater than or equal to the threshold value. The calibration code converter also includes a code selector configured to output the calibration codes or the converted calibration codes as the compensation calibration codes based on the operation mode signal.

In another embodiment, the compensation calibration codes include compensation pull-up calibration codes and compensation pull-down calibration codes. Further, the transmission circuit includes a pre-driver configured to generate a plurality of pull-up signals based on the input signal and the compensation pull-up calibration codes and configured to generate a plurality of pull-down signals based the input signal and the compensation pull-down calibration codes. The transmission circuit also includes a main driver configured to drive the signal transmission line based on the plurality of pull-up signals and the plurality of pull-down signals.

For a further embodiment, a pull-up resistance and a pull-up driving force of the main driver are adjusted based on the plurality of pull-up signals. Also, a pull-down resistance and a pull-down driving force of the main driver are adjusted based on the plurality of pull-down signals.

Also in accordance with the present teachings is a transmitting device including a calibration circuit configured to generate calibration codes by performing a calibration operation, configured to generate converted calibration codes by increasing or decreasing values of the calibration codes based on whether a number of codes among the calibration codes having a predetermined level is greater than or equal to a threshold value, and configured to generate compensation calibration codes from the calibration codes or the converted calibration codes according to an operation mode signal. The transmitting device further includes a transmission circuit configured to drive a signal transmission line based on an input signal and the compensation calibration codes.

In one embodiment, the calibration circuit is configured to generate the converted calibration codes by incrementally increasing or decreasing values of the calibration codes until the number of codes among the calibration codes having the predetermined level is less than the threshold value. In another embodiment, the calibration circuit includes a calibration code generator coupled to an external reference resistance, wherein the calibration code generator is configured to generate the calibration codes. The calibration circuit also includes a calibration code converter configured to generate the converted calibration codes from the calibration codes and configured to generate the compensation calibration codes from the calibration codes or the converted calibration codes based on the operation mode signal.

For a further embodiment, the calibration code converter includes a code decoder configured to generate the converted calibration codes by increasing or decreasing values of the calibration codes when the number of codes among the calibration codes having the predetermined level is greater than or equal to the threshold value. The calibration code converter also includes a code selector configured to output the calibration codes or the converted calibration codes as the compensation calibration codes based on the operation mode signal.

In one embodiment, the transmission circuit of the transmitting device includes a pre-driver configured to generate a plurality of pull-up signals and a plurality of pull-down signals based on the input signal and the compensation calibration codes. The transmission circuit also includes a main driver configured to drive the signal transmission line based on the plurality of pull-up signals and the plurality of pull-down signals. For a further embodiment, a pull-up resistance and a pull-up driving force of the main driver are adjusted based on the plurality of pull-up signals. Also, a pull-down resistance and a pull-down driving force of the main driver are adjusted based on the plurality of pull-down signals.

Further in accordance with the present teachings is a transmitting device including a calibration circuit configured to generate calibration codes by performing a calibration operation and configured to generate compensation calibration codes by changing the calibration codes when a number of codes among the calibration codes having a predetermined level is greater than or equal to a threshold value. The transmitting device also includes a transmission circuit configured to drive a signal transmission line based on an input signal and the compensation calibration codes, wherein the transmission circuit includes a main driver having a pull-up resistance and a pull-down resistance set based on the compensation calibration codes.

In one embodiment, the calibration circuit is configured to generate the compensation calibration codes by incrementally increasing or decreasing values of the calibration codes such that the pull-up resistance and the pull-down resistance of the main driver set based on the converted calibration codes become most adjacent to a pull-up resistance value and a pull-down resistance value, respectively, that would otherwise be set based on the calibration codes. In another embodiment, the calibration circuit includes a calibration code generator coupled to an external reference resistance, wherein the calibration code generator is configured to generate the calibration codes. The calibration circuit also includes a calibration code converter configured to generate converted calibration codes by increasing or decreasing values of the calibration codes when the number of codes among the calibration codes having the predetermined level is greater than or equal to the threshold value. The calibration code converter is further configured to generate the compensation calibration codes from the calibration codes and the converted calibration codes based on an operation mode signal.

For one embodiment, the calibration code converter includes a code decoder configured to generate the converted calibration codes by increasing or decreasing values of the calibration codes when the number of codes among the calibration codes having the predetermined level is greater than or equal to the threshold value. The calibration code converter also includes a code selector configured to output the calibration codes or the converted calibration codes as the compensation calibration codes based on the operation mode signal.

In another embodiment, the transmission circuit of the transmitting device further includes a pre-driver configured to generate a plurality of pull-up signals and a plurality of pull-down signals based on the input signal and the compensation calibration codes. The main driver is configured to drive the signal transmission line based on the plurality of pull-up signals and the plurality of pull-down signals. For a further embodiment, the pull-up resistance set based on the converted calibration codes and a pull-up driving force of the main driver are adjusted based on the plurality of pull-up signals. Also, the pull-down resistance set based on the converted calibration codes and a pull-down driving force of the main driver are adjusted based on the plurality of pull-down signals.

Hereinafter, a semiconductor apparatus according to the present invention will be described below with reference to the accompanying drawings through exemplary embodiments.

FIG. 1 shows a schematic diagram illustrating a configuration of a semiconductor system 1 in accordance with an embodiment of the present disclosure. Referring to FIG. 1, the system 1 may include a first semiconductor apparatus 110 and a second semiconductor apparatus 120. The first semiconductor apparatus 110 and the second semiconductor apparatus 120 may communicate with each other. In an embodiment, the first semiconductor apparatus 110 may be a master apparatus and the second semiconductor apparatus 120 may be a slave apparatus controlled by the first semiconductor apparatus 110. For example, the first semiconductor apparatus 110 may be a host apparatus, such as a processor or a controller, and may include a central processing unit (CPU), a graphic processing unit (GPU), a multimedia processor (MMP), a digital signal processor, and/or a memory controller. The first semiconductor apparatus 110 may be implemented in the form of a system on chip by combining multi-purpose processor chips such as an application processor (AP). The second semiconductor apparatus 120 may be a memory device and may include a volatile memory and a non-volatile memory. The volatile memory may include a static RAM (SRAM), a dynamic RAM (DRAM), and/or a synchronous DRAM (SDRAM). The non-volatile memory may include a read only memory (ROM), a programmable ROM (PROM), an electrically erase and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The first and second semiconductor apparatuses 110 and 120 may be coupled to each other through a signal transmission line 130. The first semiconductor apparatus 110 may include a pad 111, which may be coupled to the signal transmission line 130. The second semiconductor apparatus 120 may include a pad 121, which may be coupled to the signal transmission line 130. The signal transmission line 130 may be a channel, a link, or a bus. The first semiconductor apparatus 110 may include a transmission circuit 112 and a reception circuit 113. The transmission circuit 112 may be configured to transmit a signal from the first semiconductor apparatus 110 to the second semiconductor apparatus 120 through the signal transmission line 130. The reception circuit 113 may be configured to receive a signal from the second semiconductor apparatus 120 through the signal transmission line 130. In similar way, the second semiconductor apparatus 120 may include a transmission circuit 122 and a reception circuit 123. The transmission circuit 122 may be configured to transmit a signal from the second semiconductor apparatus 120 to the first semiconductor apparatus 110 through the signal transmission line 130. The reception circuit 123 may be configured to receive a signal from the first semiconductor apparatus 110 through the signal transmission line 130. In an embodiment, the signal transmission line 130 may be a data transmission line and the signal transmitted through the signal transmission line 130 may be data.

The first and second semiconductor apparatuses 110 and 120 may further include calibration circuits 114 and 124, respectively. The calibration circuits 114 and 124 may be coupled to an external reference resistance ZQ and may perform calibration operations. By performing calibration operations, the calibration circuits 114 and 124 may set resistance values of the transmission circuits 112 and 122, respectively. For example, the resistance values of the transmission circuits 112 and 122 may be set to 48 ohms, 60 ohms, 120 ohms, or 240 ohms according to results of the calibration operations. The transmission circuits 112 and 122 may have pull-up resistance values and/or a pull-up driving force for driving the signal transmission line 130 at a high level. The transmission circuits 112 and 122 may have pull-down resistance values and/or a pull-down driving force for driving the signal transmission line 130 at a low level. The pull-up resistance values and/or the pull-up driving force and the pull-down resistance values and/or the pull-down driving force of the transmission circuits 112 and 122 may be set according to results of the calibration operations. The calibration circuits 114 and 124 and the transmission circuits 112 and 122 may form a transmitting device.

Figure 2:
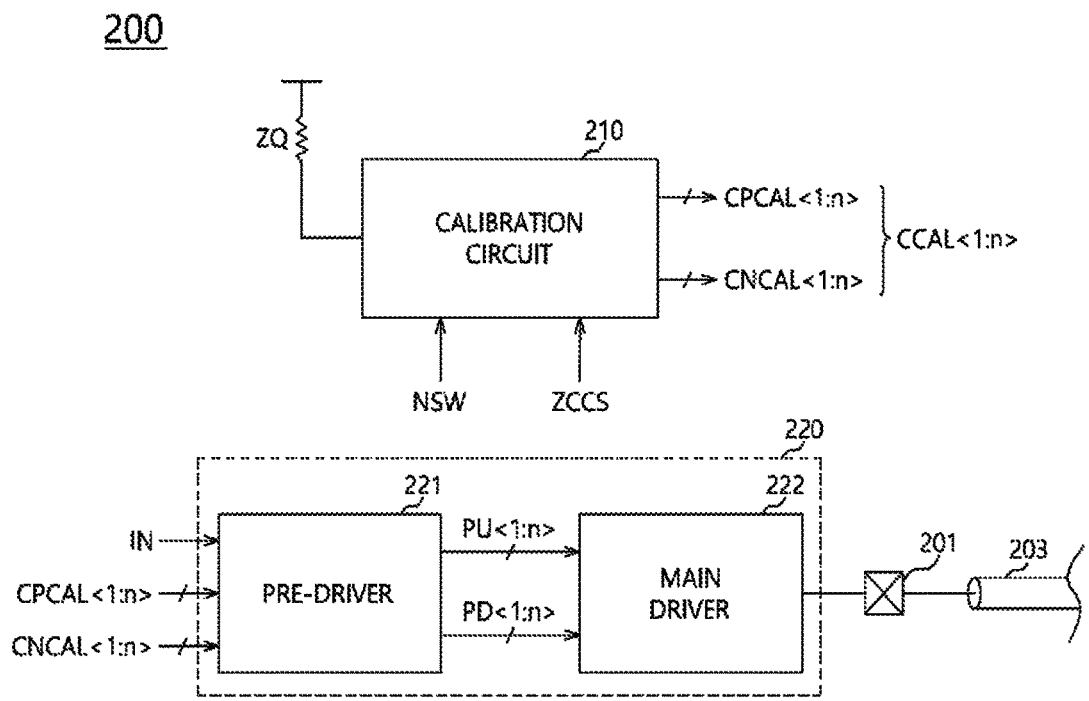
FIG. 2 shows a schematic diagram illustrating a configuration of a transmitting device in accordance with an embodiment of the present disclosure.

FIG. 2 shows a schematic diagram illustrating a configuration of a transmitting device 200 in accordance with an embodiment of the present disclosure. The transmitting device 200 may be implemented through a combination of the calibration circuits 114 and 124 and the transmission circuits 112 and 122. Referring to FIG. 2, the transmitting device 200 may include a calibration circuit 210 and a transmission circuit 220. The calibration circuit 210 may generate calibration codes by performing a calibration operation. The calibration circuit 210 may be coupled to the external reference resistance ZQ. The calibration codes may include pull-up calibration codes and pull-down calibration codes. The calibration circuit 210 may generate compensation calibration codes CCAL<1:n> (n is an integer of 2 or more) by changing the calibration codes. The calibration circuit 210 may generate compensation calibration codes CPCAL<1:n> by changing the pull-up calibration codes. The calibration circuit 210 may generate compensation calibration codes CNCAL<1:n> by changing the pull-down calibration codes.

The calibration circuit 210 may determine whether a number of codes among the calibration codes having a predetermined level is greater than or equal to a threshold value. The calibration circuit 210 may receive threshold value information NSW used to set the threshold value. For an embodiment, the threshold value may be dynamically set based on threshold value information NSW that changes as a function of time. The calibration circuit 210 may change values of the calibration codes when a number of codes among the calibration codes having the predetermined level is greater than or equal to the threshold value. For some embodiments, the calibration circuit 210 does not change values of the calibration codes when a number of codes among the calibration codes having the predetermined level is less than the threshold value. The calibration circuit 210 may generate the compensation calibration codes CCAL<1:n> by changing the calibration codes according to whether a number of codes among the calibration codes having the predetermined level is greater than or equal to the threshold value. The calibration circuit 210 may generate the compensation calibration codes CCAL<1:n> by increasing or decreasing values of the calibration codes when a number of codes among the calibration codes having the predetermined level is greater than or equal to the threshold value. The calibration circuit 210 may generate the compensation calibration codes CCAL<1:n> by maintaining the calibration codes when a number of codes among the calibration codes having the predetermined level is less than the threshold value among the calibration codes.

The calibration circuit 210 may further receive an operation mode signal ZCCS. For some embodiments, the operation mode signal ZCCS provides an indication that the first semiconductor apparatus 110 and/or the second semiconductor apparatus 120 is operating in a particular mode, such as a low power mode. For example, the operation mode signal ZCCS may be enabled based on an operation mode of the first semiconductor apparatus 110 and/or the second semiconductor apparatus 120 shown in FIG. 1. In one case, the operation mode signal ZCCS may be enabled when the first semiconductor apparatus 110 or the second semiconductor apparatus 120 operates in the low power mode. The operation mode signal ZCCS may be disabled when the first semiconductor apparatus 110 or the second semiconductor apparatus 120 is not operating in the low power mode. In another embodiment, the operation mode signal ZCCS is enabled with one of multiple states, wherein each state indicates a different operation mode of the first semiconductor apparatus 110 and/or the second semiconductor apparatus 120. For instance, if the operation mode signal ZCCS is enabled with a first voltage, then the first semiconductor apparatus 110 is operating in a low power mode. If the operation mode signal ZCCS is enabled with a second voltage, then the first semiconductor apparatus 110 is operating in a normal power mode.

The first semiconductor apparatus 110 and/or the second semiconductor apparatus 120 may be implemented as various electrical devices. Although not limited, the first semiconductor apparatus 110 or the second semiconductor apparatus 120 may require the low power mode when the first semiconductor apparatus 110 or the second semiconductor apparatus 120 is a portable electrical device using a battery. The calibration circuit 210 may generate the compensation calibration codes CCAL<1:n> by changing the calibration codes according to whether a number of codes among the calibration codes having the predetermined level is greater than or equal to the threshold value. The calibration circuit 210 may generate the compensation calibration codes CCAL<1:n> by increasing or decreasing values of the calibration codes according to whether a number of codes among the calibration codes having the predetermined level is greater than or equal to the threshold value. The calibration circuit 210 may generate the compensation calibration codes CCAL<1:n> by maintaining the calibration codes according to whether a number of codes among the calibration codes having the predetermined level is less than the threshold value. The calibration circuit 210 may output one of the calibration codes and the converted calibration codes as the compensation calibration codes CCAL<1:n> based on the operation mode signal ZCCS. The calibration circuit 210 may output the converted calibration codes as the compensation calibration codes CCAL<1:n> when the first semiconductor apparatus 110 or the second semiconductor apparatus 120 including the calibration circuit 210 operates in the low power mode. The calibration circuit 210 may output the calibration codes as the compensation calibration codes CCAL<1:n> when the first semiconductor apparatus 110 or the second semiconductor apparatus 120 including the calibration circuit 210 is not operating in the low power mode.

The transmission circuit 220 may drive a signal transmission line 203 based on an input signal IN and the compensation calibration codes CCAL<1:n>. The transmission circuit 220 may be coupled to the signal transmission line 203 through a pad 201. The transmission circuit 220 may drive the signal transmission line 203 to a level corresponding to the input signal IN based on the input signal IN and the compensation calibration codes CCAL<1:n>.

The transmission circuit 220 may include a pre-driver 221 and a main driver 222. The pre-driver 221 may generate a plurality of pull-up signals PU<1:n> and a plurality of pull-down signals PD<1:n> based on the input signal IN and the compensation calibration codes CCAL<1:n>. The pre-driver 221 may generate the plurality of pull-up signals PU<1:n> based on the input signal IN and the compensation calibration codes CPCAL<1:n>. The pre-driver 221 may generate the plurality of pull-down signals PD<1:n> based on the input signal IN and the compensation calibration codes CNCAL<1:n>.

The main driver 222 may receive the plurality of pull-up signals PU<1:n> and the plurality of pull-down signals PD<1:n>. The main driver 222 may drive the signal transmission line 203 based on the plurality of pull-up signals PU<1:n> and the plurality of pull-down signals PD<1:n>. A pull-up resistance value and/or a pull-up driving force of the main driver 222 may be set based on the plurality of pull-up signals PU<1:n>, A pull-down resistance value and/or a pull-down driving force of the main driver 222 may be set based on the plurality of pull-down signals PD<1:n>.

Figure 3:
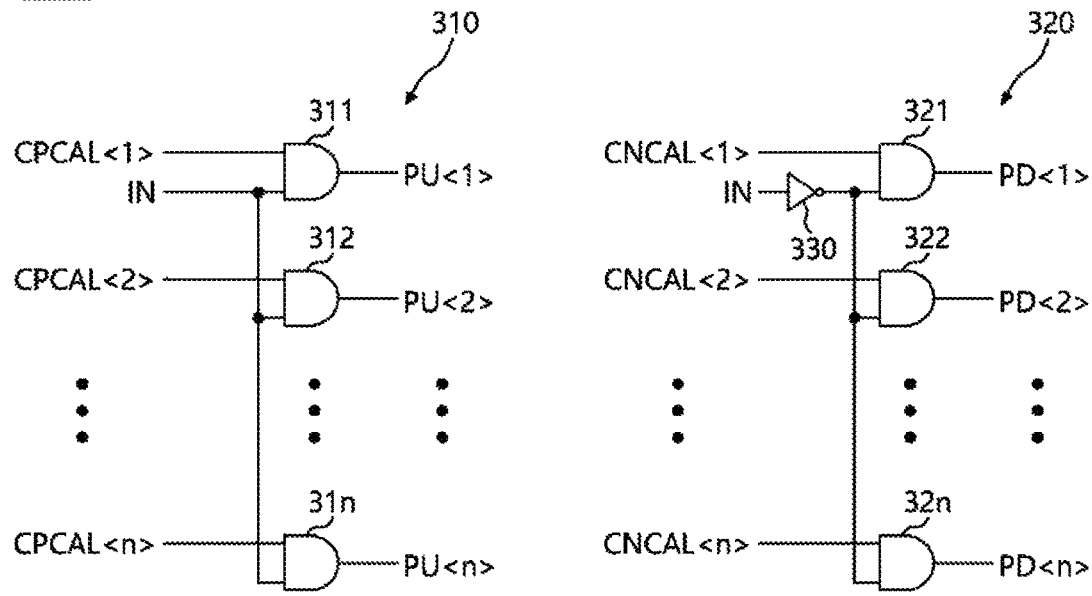
FIG. 3 shows a schematic diagram illustrating a configuration of the pre-driver shown in FIG. 2.

FIG. 3 shows a schematic diagram illustrating configuration of the pre-driver 221 shown in FIG. 2. Referring to FIG. 3, the pre-driver 221 may include a first pre-driver 310 and a second pre-driver 320. The first pre-driver 310 may generate the plurality of pull-up signals PU<1:n> based on the input signal IN and the compensation calibration codes CPCAL<1:n>. The second pre-driver 320 may generate the plurality of pull-down signals PD<1:n> based on the input signal IN and the compensation calibration codes CNCAL<1:n>.

The first pre-driver 310 may include a plurality of AND gates 311 to 31$n$. The plurality of AND gates 311 to 31$n$ may receive the input signal IN and the compensation calibration codes CPCAL<1:n>, The plurality of AND gates 311 to 31$n$ may enable the plurality of pull-up signals PU<1:n> when both of the input signal IN and the compensation calibration codes CPCAL<1:n> have a high level.

The second pre-driver 320 may include a plurality of AND gates 321 to 32$n$. The plurality of AND gates 321 to 32$n$ may receive an inverted signal of the input signal IN and the compensation calibration codes CNCAL<1:n>. The input signal IN may be inverted by the inverter 330 prior to being outputted to the plurality of AND gates 321 to 32$n$. The plurality of AND gates 321 to 32$n$ may enable the plurality of pull-down signals PD<1:n> when both of the inverted signal of the input signal IN and the compensation calibration codes CNCAL<1:n> have a high level.

Figure 4:
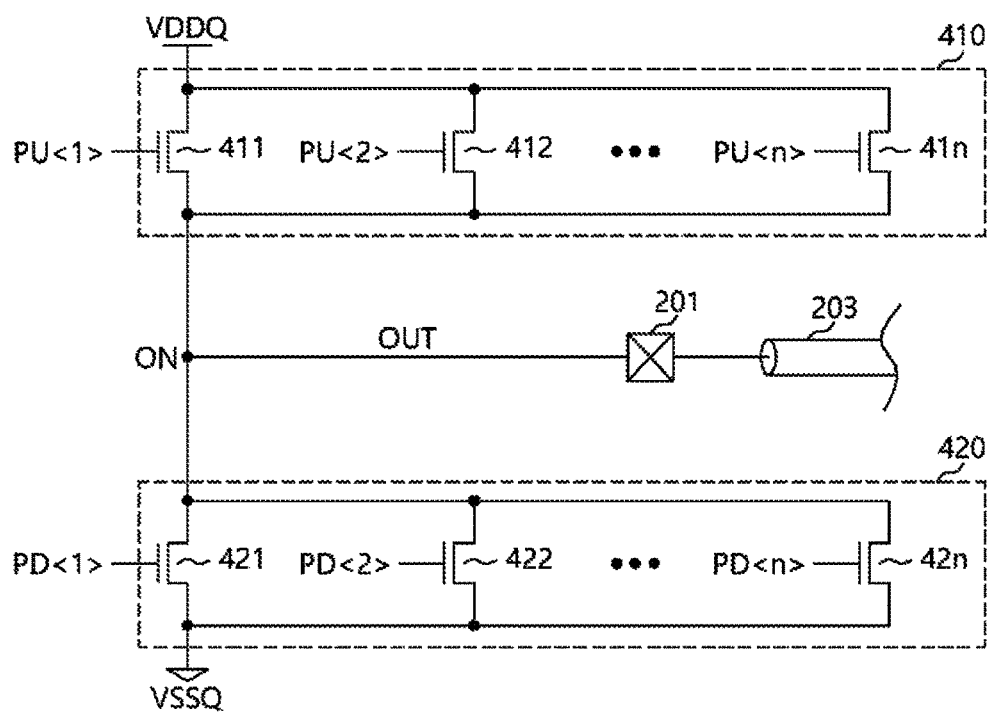
FIG. 4 shows a schematic diagram illustrating a configuration of the main driver shown in FIG. 2.

FIG. 4 shows a schematic diagram illustrating a configuration of the main driver 222 shown in FIG. 2. Referring to FIG. 4, the main driver 222 may include a pull-up driver 410 and a pull-down driver 420. The pull-up driver 410 may be coupled between a node of a power voltage VDDQ and an output node ON. The output node ON may be coupled to the signal transmission line 203. A resistance value and/or a driving force of the pull-up driver 410 may be determined according to the plurality of pull-up signals PU<1:n>. The pull-up driver 410 may pull-up drive the output node ON to the power voltage VDDQ according to the plurality of pull-up signals PU<1:n>. The pull-down driver 420 may be coupled between a node of a ground voltage VSSQ and the output node ON. A resistance value and/or a driving force of the pull-down driver 420 may be determined according to the plurality of pull-down signals PD<1:n>. The pull-down driver 420 may pull-down drive the output node ON to the ground voltage VSSQ according to the plurality of pull-down signals PD<1:n>. The pull-up driver 410 and the pull-down driver 420 may generate the output signal OUT by pull-up driving and pull-down driving the output node ON, respectively.

The pull-up driver 410 may include a plurality of transistors 411 to 41$n$. For some embodiments, the plurality of transistors 411 to 41$n$ may be N-channel MOS transistors. In other embodiments, the plurality of transistors 411 to 41$n$ may be P-channel MOS transistors. A number of transistors included in the pull-up driver 410 may correspond to a number of codes included in the compensation calibration codes CPCAL<1:n>. A first transistor 411 may receive a pull-up signal PU<1> at its gate, may be coupled to the node of the power voltage VDDQ at its drain, and may be coupled the output node ON at its source. A second transistor 412 may receive a pull-up signal PU<2> at its gate, may be coupled to the node of the power voltage VDDQ at its drain, and may be coupled to the output node ON at its source. An $n^{th}$ transistor 41$n$ may receive a pull-up signal PU<n> at its gate, may be coupled to the node of the power voltage VDDQ at its drain, and may be coupled to the output node ON at its source.

The pull-down driver 420 may include a plurality of transistors 421 to 42$n$. In some embodiments, the plurality of transistors 421 to 42$n$ may be N-channel MOS transistors. In other embodiments, the plurality of transistors 421 to 42$n$ may be P-channel MOS transistors. The pull-down driver 420 may include transistors, a number of which corresponds to a number of codes included in the compensation calibration codes CNCAL<1:n>. A first transistor 421 may receive a pull-down signal PD<1> at its gate, may be coupled to the node of the ground voltage VSSQ at its source, and may be coupled to the output node ON at its drain. A second transistor 422 may receive a pull-down signal PD<2> at its gate, may be coupled to the node of the ground voltage VSSQ at its source, and may be coupled to the output node ON at its drain. An $n^{th}$ transistor 42$n$ may receive a pull-down signal PD<n> at its gate, may be coupled to the node of the ground voltage VSSQ at its source, and may be coupled to the output node ON at its drain.

The resistance value and/or the driving force of the pull-up driver 410 may vary according to a number of pull-up signals PU<1:n>. The resistance value and/or the driving force of the pull-down driver 420 may vary according to a number of pull-down signals PD<1:n>. As a number of enabled pull-up signals and pull-down signals become greater, a greater number of the transistors may be turned on and power consumption of the main driver 222 may increase. As a number of enabled pull-up signals and pull-down signals become smaller, a smaller number of the transistors may be turned on and power consumption of the main driver 222 may decrease.

Figure 5:
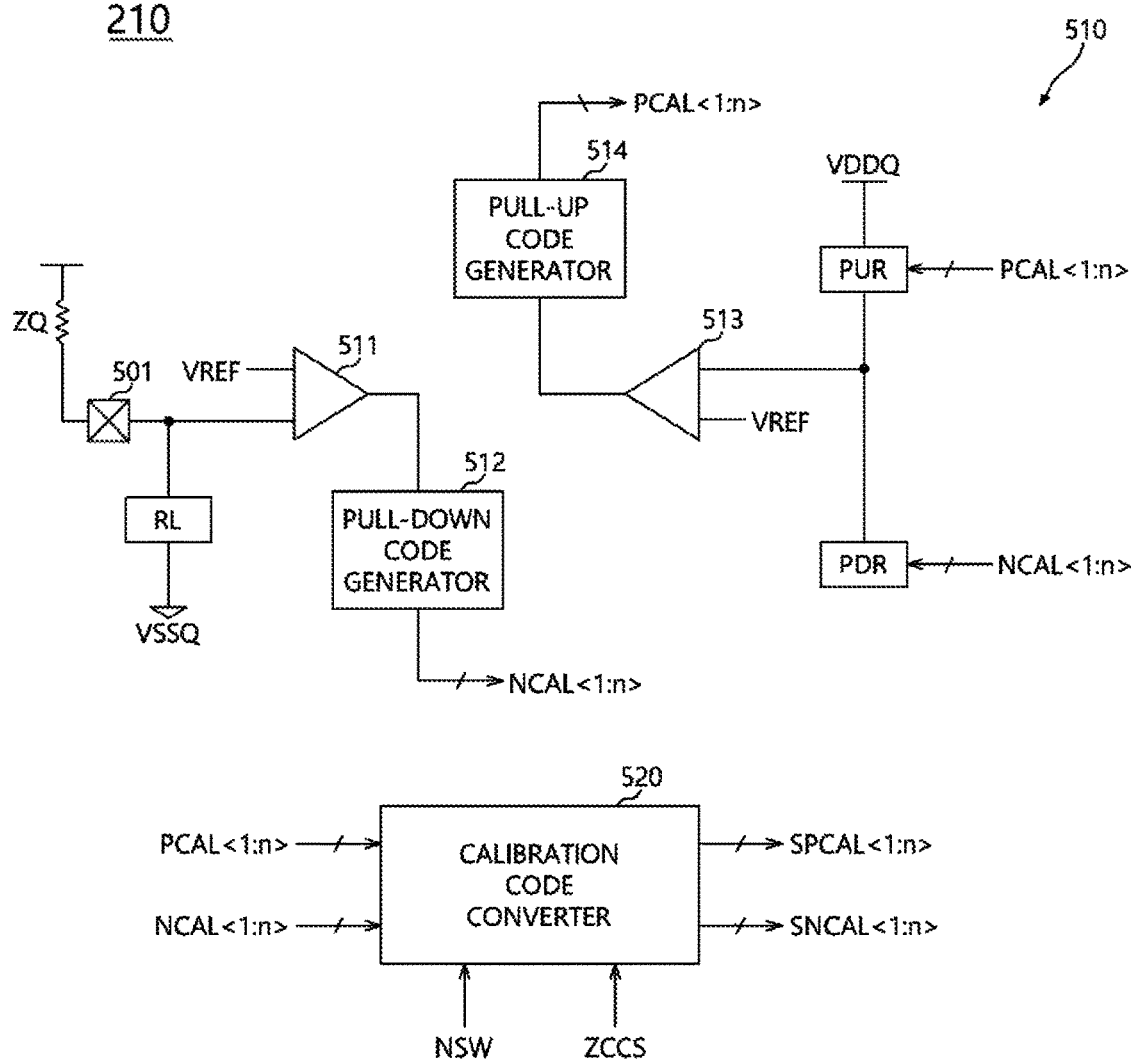
FIG. 5 shows a schematic diagram illustrating a configuration of the calibration circuit shown in FIG. 2.

FIG. 5 shows a schematic diagram illustrating a configuration of the calibration circuit 210 shown in FIG. 2. Referring to FIG. 5, the calibration circuit 210 may include a calibration code generator 510 and a calibration code converter 520. The calibration code generator 510 may be coupled to the external reference resistance ZQ and may generate the calibration codes. The calibration codes may include pull-up calibration codes PCAL<1:n> and pull-down calibration codes NCAL<1:n>. The calibration code generator 510 may be coupled to the external reference resistance ZQ through a reference resistance pad 501.

The calibration code converter 520 may receive the calibration codes PCAL<1:n> and NCAL<1:n> generated by the calibration code generator 510. Also, the calibration code converter 520 may receive the threshold value information NSW and the operation mode signal ZCCS. The calibration code converter 520 may generate converted calibration codes SPCAL<1:n> and SNCAL<1:n> by increasing or decreasing values of the calibration codes PCAL<1:n> and NCAL<1:n> when a number of codes having the predetermined level is greater than or equal to the threshold value. For an embodiment, the threshold value is based on the threshold value information NSW received by the calibration code converter 520 in addition to the calibration codes PCAL<1:n> and NCAL<1:n>. The calibration code converter 520 may generate converted pull-up calibration codes SPCAL<1:n> by increasing or decreasing values of the pull-up calibration codes PCAL<1:n> when a number of codes having the predetermined level is greater than or equal to the threshold value for the pull-up calibration codes PCAL<1:n>. The calibration code converter 520 may generate converted pull-down calibration codes SNCAL<1:n> by increasing or decreasing values of the pull-down calibration codes NCAL<1:n> when a number of codes having the predetermined level is greater than or equal to the threshold value for the pull-down calibration codes NCAL<1:n>.

The calibration code converter 520 may output one of the calibration codes PCAL<1:n> and NCAL<1:n> and the converted calibration codes SPCAL<1:n> and SNCAL<1:n> as compensation calibration codes CPCAL<1:n> and CNCAL<1:n> based on the operation mode signal ZCCS. When the operation mode signal ZCCS is enabled, the calibration code converter 520 may output the converted calibration codes SPCAL<1:n> and SNCAL<1:n> as the compensation calibration codes CPCAL<1:n> and CNCAL<1:n>. When the operation mode signal ZCCS is enabled, the calibration code converter 520 may output the converted pull-up calibration codes SPCAL<1:n> as adjusted pull-up calibration codes CPCAL<1:n> and may output the converted pull-down calibration codes SNCAL<1:n> as adjusted pull-down calibration codes CNCAL<1:n>. When the operation mode signal ZCCS is disabled, the calibration code converter 520 may output the calibration codes PCAL<1:n> and NCAL<1:n> as the compensation calibration codes CPCAL<1:n> and CNCAL<1:n>. When the operation mode signal ZCCS is disabled, the calibration code converter 520 may output the pull-up calibration codes PCAL<1:n> as the adjusted pull-up calibration codes CPCAL<1:n> and may output the pull-down calibration codes NCAL<1:n> as the adjusted pull-down calibration codes CNCAL<1:n>.

The calibration code generator 510 may include a reference resistance leg RL, a first comparator 511, a pull-down code generator 512, a pull-down resistance PDR, a pull-up resistance PUR, a second comparator 513, and a pull-up code generator 514. The reference resistance leg RL may be coupled to the external reference resistance ZQ through the reference resistance pad 501. For example, the external reference resistance ZQ may be coupled to the power voltage VDDQ, and the reference resistance leg RL may be a pull-down resistance coupled to the ground voltage VSS. In an embodiment, the external reference resistance ZQ may be coupled to the ground voltage VSS, and the reference resistance leg RL may be a pull-up resistance coupled to the power voltage VDDQ. The first comparator 511 may compare levels of a reference voltage VREF and a voltage in accordance with a resistance ratio between the external reference resistance ZQ and the reference resistance leg RL. The reference voltage VREF may have half the level of the power voltage VDDQ of the calibration circuit 210. The pull-down code generator 512 may generate the pull-down calibration codes NCAL<1:n> based on the comparison result of the first comparator 511. For example, the pull-down code generator 512 may increase or decrease values of the pull-down calibration codes NCAL<1:n> based the comparison result of the first comparator 511. The pull-down resistance PDR may receive the pull-down calibration codes NCAL<1:n> and may have a variable resistance value based on the pull-down calibration codes NCAL<1:n>.

The pull-up resistance PUR may be coupled to the pull-down resistance PDR. The second comparator 513 may compare levels of the reference voltage VREF and a voltage based on a resistance ratio between the pull-up resistance PUR and the pull-down resistance PDR. The pull-up code generator 514 may generate the pull-up calibration codes PCAL<1:n> according to the comparison result of the second comparator 513. For example, the pull-up code generator 514 may increase or decrease values of the pull-up calibration codes PCAL<1:n> based on the comparison result of the second comparator 513. The pull-up resistance PUR may receive the pull-up calibration codes PCAL<1:n> and may have a variable resistance value based on the pull-up calibration codes PCAL<1:n>. In an embodiment, the calibration code generator 510 may first set the pull-up calibration codes PCAL<1:n> and then set the pull-down calibration codes NCAL<1:n> based on the previously set pull-up calibration codes PCAL<1:n>.

Figure 6:
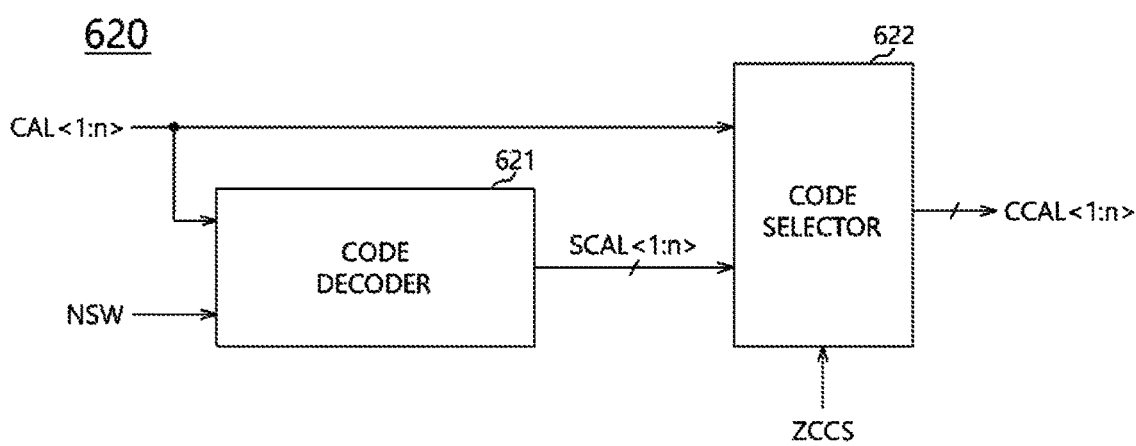
FIG. 6 shows a schematic diagram illustrating a configuration of a calibration code converter in accordance with an embodiment of the present disclosure.

FIG. 6 shows a schematic diagram illustrating a configuration of a calibration code converter 620 in accordance with an embodiment of the present disclosure. For some embodiments the calibration code converter 620 may represent the calibration code converter 520 shown in FIG. 5. Referring to FIG. 6, the calibration code converter 620 may include a code decoder 621 and a code selector 622. The code decoder 621 may receive the calibration codes CAL<1:n> and the threshold value information NSW. The code decoder 621 may generate the converted calibration codes SCAL<1:n> by increasing or decreasing values of the calibration codes CAL<1:n> when a number of codes among the calibration codes having the predetermined level is greater than or equal to the threshold value. An operation of the code decoder 621 of the calibration code converter 620 will be described later. In an embodiment, the calibration code converter 620 may receive the pull-up calibration codes PCAL<1:n> and the pull-down calibration codes NCAL<1:n> to generate the adjusted pull-up calibration codes CPCAL<1:n> and the adjusted pull-down calibration codes CNCAL<1:n>. In an embodiment, two (2) calibration code converters may be provided to generate the adjusted pull-up calibration codes CPCAL<1:n> from the pull-up calibration codes PCAL<1:n> and generate the adjusted pull-down calibration codes CNCAL<1:n> from the pull-down calibration codes NCAL<1:n>. For example, a first calibration code converter generates the adjusted pull-up calibration codes CPCAL<1:n> from the pull-up calibration codes PCAL<1:n>, and a second calibration code converter generates the adjusted pull-down calibration codes CNCAL<1:n> from the pull-down calibration codes NCAL<1:n>.

The code selector 622 may receive the calibration codes CAL<1:n>, the converted calibration codes SCAL<1:n>, and the operation mode signal ZCCS. The code selector 622 may output, based on the operation mode signal ZCCS, either the calibration codes CAL<1:n> or the converted calibration codes SCAL<1:n> as the compensation calibration codes CCAL<1:n>. The code selector 622 may be a multiplexor configured to output, based on the operation mode signal ZCCS, either the calibration codes CAL<1:n> or the converted calibration codes SCAL<1:n> as the compensation calibration codes CCAL<1:n>. The code selector 622 may output the converted calibration codes SCAL<1:n> as the compensation calibration codes CCAL<1:n> when the operation mode signal ZCCS is enabled. The code selector 622 may output the calibration codes CAL<1:n> as the compensation calibration codes CCAL<1:n> when the operation mode signal ZCCS is disabled.

Figure 7A:
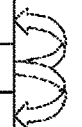
Figure 7A:
Figure 7A:

FIGS. 7A and 7B show a table illustrating an operation of the code decoder 621 shown in FIG. 6. FIGS. 7A and 7B tabulate the six codes of the calibration codes CAL<1:6> and a sum SUM of a number of codes among the calibration codes CAL<1:6> having a high. When the calibration codes CAL<1:6> are 6-bit signals, the threshold value may be 4 for an embodiment. When a number of codes among the calibration codes CAL<1:6> having a high level is 4, the code decoder 621 may increase or decrease values of the calibration codes CAL<1:6> such that a number of codes having a high level is below 3. Also, the code decoder 621 may minimize errors between a resistance value of the main driver 222 set based on the calibration codes CAL<1:6> and a resistance value of the main driver 222 set based on converted calibration codes by converting the calibration codes CAL<1:6> into the converted calibration codes having values adjacent to the values of the calibration codes CAL<1:6>.

When the calibration codes CAL<1:6> are 6-bit signals, the calibration codes CAL<1:6> may have any one of 64 ($2^6$) different sets of code values. FIGS. 7A and 7B show the 64 possible sets of code values, with each row of the table indicting a different set. The rows of codes are arranged in ascending order of a binary representation of the six codes of the calibration codes CAL<1:6>. As shown, the row numbers appearing in the first column indicate the binary value for the set of six code values for each row. Among the first 15 sets of calibration codes, as indicated by row number, a number (indicated in the SUM column of the table) of codes having a high level (i.e., 1) is under 3. Thus, for an embodiment, the code decoder 621 does not convert values of the original calibration codes because the SUM is less than a threshold value of 4.

A number of codes having a high level is equal to the threshold value of 4 for the $16^{th}$ set of calibration codes. Thus the code decoder 621 may generate the converted calibration codes by increasing or decreasing values for the $16^{th}$ set of calibration codes. The code decoder 621 may convert the $16^{th}$ set of calibration codes into the $15^{th}$ set of calibration codes or the $17^{th}$ set of calibration codes, each of which has 3 or less codes having a high level and each of which has values adjacent to the values of the $16^{th}$ set of calibration codes. The code decoder 621 may output the $15^{th}$ set of calibration codes or the $17^{th}$ set of calibration codes as the converted calibration codes of the $16^{th}$ set of calibration codes.

As shown, converting the values of the $16^{th}$ set of calibration codes to the values of the $17^{th}$ set of calibration codes represents an increase in the values of the $16^{th}$ set of calibration codes. This is because the binary value for the set of six code values for row 17 is one greater than the binary value for the set of six code values for row 16. Converting the values of the $16^{th}$ set of calibration codes to the values of the 15$^{th}$ set of calibration codes represents a decrease in the values of the 16$^{th}$ set of calibration codes. This is because the binary value for the set of six code values for row 15 is one less than the binary value for the set of six code values for row 16. In this case, rows 15 and 17 are immediately adjacent to the row 16. Rows 15 and 17 are also the most adjacent rows to row 16 for which a number of codes among the calibration codes CAL<1:6> having a high level is less than the threshold value of 4.

A number of codes having a high level is 4 among the 24$^{th}$ set of calibration codes. Thus, the code decoder 621 may generate the converted calibration codes by increasing or decreasing values of the 24$^{th}$ set of calibration codes. The code decoder 621 may convert the 24$^{th}$ set of calibration codes into the 23$^{th}$ set of calibration codes or the 25$^{th}$ set of calibration codes, each of which has 3 or less codes having a high level and each of which has values adjacent to the values of the 24$^{th}$ set of calibration codes. The code decoder 621 may output the 23$^{th}$ set of calibration codes or the 25$^{th}$ set of calibration codes as the converted calibration codes of the 24$^{th}$ set of calibration codes.

In similar way, the code decoder 621 may convert the 28$^{th}$ set of calibration codes, the 40$^{th}$ set of calibration codes, the 44$^{th}$ set of calibration codes, and the 52$^{nd}$ set of calibration codes into the 27$^{th}$ set of calibration codes or the 29$^{th}$ set of calibration codes, the 39$^{th}$ set of calibration codes or the 41$^{st}$ set of calibration codes, the 43$^{rd}$ set of calibration codes or the 45$^{th}$ set of calibration codes, and the 51$^{st}$ set of calibration codes or the 53$^{rd}$ set of calibration codes, respectively. The code decoder 621 may output the 27$^{th}$ set of calibration codes or the 29$^{th}$ set of calibration codes, the 39$^{th}$ set of calibration codes or the 41$^{st}$ set of calibration codes, the 43$^{rd}$ set of calibration codes or the 45$^{th}$ set of calibration codes and the 51$^{st}$ set of calibration codes or the 53$^{rd}$ set of calibration codes as the converted calibration codes of the 28$^{th}$ set of calibration codes, the 40$^{th}$ set of calibration codes, the 44$^{th}$ set of calibration codes and the 52$^{nd}$ set of calibration codes, respectively.

The consecutive 30$^{th}$ to 32$^{nd}$ sets of calibration codes all have 4 or more codes having a high level, as indicated by the SUM column. Specifically, the 30$^{th}$, 31$^{st}$, and 32$^{nd}$ sets of calibration codes have SUMs of 4, 4, and 5, respectively. Therefore, the code decoder 621 converts the 30$^{th}$ to 32$^{nd}$ sets of calibration codes into the 29$^{th}$ or 33$^{rd}$ set of calibration codes, each of which has 3 or less codes having a high level and each of which has values adjacent to the values of the 30$^{th}$ to 32$^{nd}$ sets of calibration codes. The code decoder 621 outputs the converted calibration codes in order to minimize errors between a resistance value of the main driver 222 set based on the 30$^{th}$ to 32$^{nd}$ sets of calibration codes and a resistance value of the main driver 222 set based on the converted calibration codes. The code decoder 621 may output the 29$^{th}$ or 33$^{rd}$ set calibration codes as the converted calibration codes of the 30$^{th}$ to 32$^{nd}$ sets of calibration codes.

The 46$^{th}$ to 48$^{th}$ sets of calibration codes, each of which has a sum of 4 or more, may be converted into the 45$^{th}$ or 49$^{th}$ set of calibration codes. The 54$^{th}$ to 56$^{th}$ sets of calibration codes, each of which has a sum of 4 or more, may be converted into the 53$^{rd}$ or 57$^{th}$ set of calibration codes. The 58$^{th}$ to 64$^{th}$ sets of calibration codes, each of which has a sum of 4 or more, may be converted into the 57$^{th}$ set of calibration codes.

Although FIGS. 7A and 7B illustrates an example of a conversion method for the calibration codes CAL<1:6> performed by the code decoder 621, the present teachings are not limited to the illustrated conversion method. For an embodiment, the code decoder 621 incrementally increases or decreases values of the calibration codes CAL<1:6> until the calibration codes CAL<1:6> are converted such that a number of codes having the predetermined level is less than the threshold value.

Described hereinafter with reference to FIGS. 2 to 6 is an operation of the transmitting device 200 in accordance with an embodiment of the present disclosure. The calibration code generator 510 may perform a calibration operation by using the external reference resistance ZQ to generate the pull-up calibration codes PCAL<1:n> and the pull-down calibration codes NCAL<1:n>. The code decoder 621 of the calibration code converter 520 may generate the converted pull-up calibration codes SPCAL<1:n>. For the converted pull-up calibration codes SPCAL<1:n>, the number of codes having a predetermined level is less than a threshold value. To get the converted pull-up calibration codes SPCAL<1:n>, the code decoder 621 increases or decreases values of the pull-up calibration codes PCAL<1:n> when a number of codes having the predetermined level is greater than or equal to the threshold value among the pull-up calibration codes PCAL<1:n>. For an embodiment, the threshold value is based on the threshold value information NSW. The code decoder 621 of the calibration code converter 520 may generate the converted pull-down calibration codes SNCAL<1:n>. For converted pull-down calibration codes SNCAL<1:n>, the number of codes having the predetermined level is less than the threshold value. To get the converted pull-down calibration codes SNCAL<1:n>, the code decoder 621 increases or decreases values of the pull-down calibration codes NCAL<1:n> when a number of codes having the predetermined level is greater than or equal to the threshold value among the pull-down calibration codes NCAL<1:n>. When a semiconductor apparatus including the transmitting device 200 operates in a low power mode, the operation mode signal ZCCS may be enabled. The code selector 622 of the calibration code converter 520 may output the converted pull-up calibration codes SPCAL<1:n> as the adjusted pull-up calibration codes CPCAL<1:n> based on the enabled operation mode signal ZCCS. The code selector 622 of the calibration code converter 520 may output the converted pull-down calibration codes SNCAL<1:n> as the adjusted pull-down calibration codes CNCAL<1:n> based on the enabled operation mode signal ZCCS. The pre-driver 221 may generate the plurality of pull-up signals PU<1:n> based on the input signal IN and the compensation calibration codes CPCAL<1:n>, which are generated from the converted pull-up calibration codes SPCAL<1:n>. The pre-driver 221 may generate the plurality of pull-down signals PD<1:n> according to the input signal IN and the compensation calibration codes CNCAL<1:n>, which are generated from the converted pull-down calibration codes SNCAL<1:n>. Therefore, a number of enabled pull-up signals PU<1:n> and enabled pull-down signals PD<1:n> may be less than the threshold value and the power consumption of the main driver 222 for driving the signal transmission line 203 may be limited. Herein, there may be an error between a resistance value of the main driver 222 set according to the calibration codes PCAL<1:n> and NCAL<1:n> and a resistance value of the main driver 222 set according to the converted calibration codes SPCAL<1:n> and SNCAL<1:n>. However, since the calibration code converter 520 generates the converted calibration codes SPCAL<1:n> and SNCAL<1:n> having values adjacent to values of the calibration codes PCAL<1:n> and NCAL<1:n>, the resistance value error of the main driver 222 may be minimized.

When a semiconductor apparatus including the transmitting device 200 is not in the low power mode, the operation mode signal ZCCS may be disabled. The code selector 622 of the calibration code converter 520 may output the pull-up calibration codes PCAL<1:n> as the adjusted pull-up calibration codes CPCAL<1:n> based on the disabled operation mode signal ZCCS. The code selector 622 of the calibration code converter 520 may output the pull-down calibration codes NCAL<1:n> as the adjusted pull-down calibration codes CNCAL<1:n> based on the disabled operation mode signal ZCCS. The pre-driver 221 may generate the plurality of pull-up signals PU<1:n> based on the input signal IN and the compensation calibration codes CPCAL<1:n>, which are generated from the pull-up calibration codes PCAL<1:n>. The pre-driver 221 may generate the plurality of pull-down signals PD<1:n> based on the input signal IN and the compensation calibration codes CNCAL<1:n>, which are generated from the pull-down calibration codes NCAL<1:n>. Therefore, the resistance value of the main driver 222 may be precisely set without an error according to the pull-up signals PU<1:n> and the pull-down signals PD<1:n> generated on the basis of the pull-up calibration codes PCAL<1:n> and the pull-down calibration codes NCAL<1:n>, Although the power consumption of the main driver 222 for driving the signal transmission line 203 might not be limited, a signal may be transmitted without an error through the signal transmission line 203.

While certain embodiments have been described above for illustrative purposes, it will be understood by those skilled in the art that the disclosed embodiments represent only a subset of possible embodiments consistent with the present teachings. Accordingly, a transmitting device using calibration circuit or a semiconductor apparatus and system including the same should not be limited based on the described embodiments. Rather, the transmitting device using the calibration circuit and the semiconductor apparatus and system including the same should only be limited in light of the claims that follow when taken in conjunction with the written description and the accompanying drawings.

What is claimed is:

1. A transmitting device comprising:
a calibration circuit configured to generate calibration codes by performing a calibration operation and configured to generate compensation calibration codes by increasing or decreasing values of the calibration codes based on whether a number of codes among the calibration codes having a predetermined level is greater than or equal to a threshold value, such that a number of codes among the compensation calibration codes having the predetermined level is less than the threshold value; and
a transmission circuit configured to drive a signal transmission line based on an input signal and the compensation calibration codes.

2. The transmitting device of claim 1, wherein the calibration circuit comprises:
a calibration code generator coupled to an external reference resistance and configured to generate the calibration codes; and
a calibration code converter configured to generate converted calibration codes from the calibration codes and configured to select the calibration codes or the converted calibration codes as the compensation calibration codes based on an operation mode signal.

3. The transmitting device of claim 2, wherein the calibration code converter comprises:

a code decoder configured to generate the converted calibration codes by increasing or decreasing values of the calibration codes when the number of codes among the calibration codes having the predetermined level is greater than or equal to the threshold value; and
a code selector configured to output the calibration codes or the converted calibration codes as the compensation calibration codes based on the operation mode signal.

4. The transmitting device of claim 2, wherein the operation mode signal provides an indication that a semiconductor apparatus associated with the transmission circuit is operating in a low power mode.

5. The transmitting device of claim 4, wherein the operation mode signal is enabled when the semiconductor apparatus associated with the transmission circuit is operating in the low power mode.

6. The transmitting device of claim 1,
wherein the compensation calibration codes include compensation pull-up calibration codes and compensation pull-down calibration codes, and
wherein the transmission circuit comprises:
a pre-driver configured to generate a plurality of pull-up signals based on the input signal and the compensation pull-up calibration codes and configured to generate a plurality of pull-down signals based the input signal and the compensation pull-down calibration codes; and
a main driver configured to drive the signal transmission line based on the plurality of pull-up signals and the plurality of pull-down signals.

7. The transmitting device of claim 6, wherein a pull-up resistance and a pull-up driving force of the main driver are adjusted based on the plurality of pull-up signals, and wherein a pull-down resistance and a pull-down driving force of the main driver are adjusted based on the plurality of pull-down signals.

8. A transmitting device comprising:
a calibration code generator coupled to an external reference resistance and configured to generate a calibration codes; and
a calibration code converter configured to generate a converted calibration codes from the calibration codes and configured to generate a compensation calibration codes from either the calibration codes or the converted calibration codes based on an operation mode signal; and
a transmission circuit configured to drive a signal transmission line based on an input signal and the compensation calibration codes.

9. The transmitting device of claim 8, wherein the calibration code converter is configured to generate the converted calibration codes by incrementally increasing or decreasing values of the calibration codes until the number of codes among the calibration codes having the predetermined level is less than the threshold value.

10. The transmitting device of claim 8, wherein the calibration code converter comprises:
a code decoder configured to generate the converted calibration codes by increasing or decreasing values of the calibration codes when the number of codes among the calibration codes having the predetermined level is greater than or equal to the threshold value; and
a code selector configured to output the calibration codes or the converted calibration codes as the compensation calibration codes based on the operation mode signal.

11. The transmitting device of claim 8, wherein the transmission circuit comprises:

a pre-driver configured to generate a plurality of pull-up signals and a plurality of pull-down signals based on the input signal and the compensation calibration codes; and a main driver configured to drive the signal transmission line based on the plurality of pull-up signals and the plurality of pull-down signals.

12. The transmitting device of claim 11, wherein a pull-up resistance and a pull-up driving force of the main driver are adjusted based on the plurality of pull-up signals, and wherein a pull-down resistance and a pull-down driving force of the main driver are adjusted based on the plurality of pull-down signals.

13. A transmitting device comprising:

a calibration circuit configured to generate calibration codes by performing a calibration operation and configured to generate compensation calibration codes by changing the calibration codes when a number of codes among the calibration codes having a predetermined level is greater than or equal to a threshold value, such that a number of codes among the compensation calibration codes having the predetermined level is less than the threshold value; and a transmission circuit configured to drive a signal transmission line based on an input signal and the compensation calibration codes, wherein the transmission circuit comprises a main driver having a pull-up resistance and a pull-down resistance set based on the compensation calibration codes.

14. The transmitting device of claim 13, wherein the calibration circuit is configured to generate the compensation calibration codes by incrementally increasing or decreasing values of the calibration codes such that the pull-up resistance and the pull-down resistance of the main driver become most adjacent to a pull-up resistance value and a pull-down resistance value, respectively, that would otherwise be set based on the calibration codes.

15. The transmitting device of claim 13, wherein the calibration circuit comprises:

a calibration code generator coupled to an external reference resistance, wherein the calibration code generator is configured to generate the calibration codes; and a calibration code converter configured to generate converted calibration codes by increasing or decreasing values of the calibration codes when the number of codes among the calibration codes having the predetermined level is greater than or equal to the threshold value and configured to generate the compensation calibration codes from the calibration codes and the converted calibration codes based on an operation mode signal.

16. The transmitting device of claim 15, wherein the calibration code converter comprises:

a code decoder configured to generate the converted calibration codes by increasing or decreasing values of the calibration codes when the number of codes among the calibration codes having the predetermined level is greater than or equal to the threshold value; and a code selector configured to output the calibration codes or the converted calibration codes as the compensation calibration codes based on the operation mode signal.

17. The transmitting device of claim 13, wherein the transmission circuit further comprises a pre-driver configured to generate a plurality of pull-up signals and a plurality of pull-down signals based on the input signal and the compensation calibration codes, and wherein the main driver is configured to drive the signal transmission line based on the plurality of pull-up signals and the plurality of pull-down signals.

18. The transmitting device of claim 17, wherein the pull-up resistance and a pull-up driving force of the main driver are adjusted based on the plurality of pull-up signals, and wherein the pull-down resistances and a pull-down driving force of the main driver are adjusted based on the plurality of pull-down signals.

* * * * *